United States Patent
Tandon et al.

(10) Patent No.: US 12,525,967 B2
(45) Date of Patent: *Jan. 13, 2026

(54) DELAY LOCKED LOOP

(71) Applicant: NXP USA, Inc., Austin, TX (US)

(72) Inventors: Prakhar Tandon, Hyderabad (IN); Dileep Ramanolla, Hyderabad (IN); Uma Maheswara Reddy Poreddy, Hyderabad (IN); Shivesh Kumar Dubey, Hyderabad (IN)

(73) Assignee: NXP USA, Inc., Austin, TX (US)

( * ) Notice: Subject to any disclaimer, the term of this patent is extended or adjusted under 35 U.S.C. 154(b) by 28 days.

This patent is subject to a terminal disclaimer.

(21) Appl. No.: 18/768,807

(22) Filed: Jul. 10, 2024

(65) Prior Publication Data

US 2025/0030411 A1 Jan. 23, 2025

(30) Foreign Application Priority Data

Jul. 20, 2023 (IN) .............................. 202311048972

(51) Int. Cl.
*H03K 5/14* (2014.01)
*H03K 5/133* (2014.01)

(52) U.S. Cl.
CPC .............. *H03K 5/14* (2013.01); *H03K 5/133* (2013.01)

(58) Field of Classification Search
CPC ........... H03K 5/14; H03K 5/133; H03K 5/131
USPC ......................................................... 375/376
See application file for complete search history.

(56) References Cited

U.S. PATENT DOCUMENTS

| 10,965,292 B1* | 3/2021 | Okuno | ................ H03L 7/0816 |
| 2009/0072878 A1* | 3/2009 | Kim | .......................... G06F 7/68 |
| | | | 327/298 |
| 2011/0032009 A1* | 2/2011 | Iwane | ..................... H03L 7/095 |
| | | | 327/142 |

(Continued)

FOREIGN PATENT DOCUMENTS

| EP | 0487902 A2 | 6/1992 |
| KR | 20210093723 A | 7/2021 |

OTHER PUBLICATIONS

Chithra et al., "Auto-Zeroing Static Phase Offset in DDLs Using a Digitally Programmable Sensing Circuit", IEEE Transactions on Circuits and Systems—II: Express Briefs, 2021-06-01, pp. 1788-1792, vol. 68, No. 6, IEEE, Piscataway, NJ, USA.

(Continued)

*Primary Examiner* — Leila Malek

(57) ABSTRACT

A delay locked loop (DLL) circuit includes a voltage-controlled delay line (VCDL) that applies a time delay to a clock-in signal to provide a first output signal and a last output signal. The magnitude of the time delay is based on the control-voltage signal and a delay code. The DLL circuit includes a feedback circuit configured to provide a feedback voltage signal based on the phase difference between the first output signal and the last output signal. In a calibration mode: a fixed voltage source provides a fixed voltage signal as the control-voltage signal for the VCDL; and a delay code setter applies a delay code setting signal to the VCDL to identify a selected-delay-code as the code. In an active mode: the feedback circuit provides the feedback voltage signal as the control-voltage signal for the VCDL; and the VCDL uses the selected-delay-code as the delay code.

15 Claims, 7 Drawing Sheets

(56) References Cited

U.S. PATENT DOCUMENTS

2011/0098977 A1\* 4/2011 Shang .............. G01R 31/31718
 702/186
2012/0119802 A1 5/2012 Aremallapur

OTHER PUBLICATIONS

Mesgarzadeh, Behzad et al., "A Low-Power Digital DDL-Based Clock Generator in Open-Loop Mode", IEEE Journal of Solid-State Circuits, Jul. 1, 2009, 1907-1913, vol. 44, No. 7, IEEE, Piscataway, NJ, USA.

Nagaraju, Manohar et al., "Process-Variation Tolerant Design Techniques for Multiphase Clock Generation", 17th IEEE International Conference on Electronics, Circuits and Systems (ICECS), Dec. 12, 2010, pp. 102-105, IEEE, Piscataway, NJ, USA.

\* cited by examiner

DELAY LOCKED LOOP

CROSS-REFERENCE TO RELATED APPLICATIONS

This application claims priority under 35 U.S.C. § 119 to Indian patent application no. 202311048972, filed Jul. 20, 2023, the contents of which are incorporated by reference herein.

FIELD

The present disclosure relates to delay locked loop circuits.

SUMMARY

According to a first aspect of the present disclosure there is provided a delay locked loop circuit comprising:
- a voltage-controlled delay line that comprises one or more variable components, wherein the voltage-controlled delay line is configured to:
  - receive a clock-in signal;
  - receive a control-voltage signal; and
  - apply a time delay to the clock-in signal in order to provide a first output signal and a last output signal, wherein the magnitude of the time delay is based on the control-voltage signal and a delay code, and wherein the delay code defines the values of the one or more variable components in the voltage-controlled delay line;
- a feedback circuit that is configured to provide a feedback voltage signal based on the phase difference between the first output signal and the last output signal;
- a delay code setter that is configured to provide a delay code setting signal that represents one of a sequence of different candidate delay codes;
- a fixed voltage source that is configured to provide a fixed voltage signal; and
- a switching circuit that is configured to put the delay locked loop circuit in either an active mode of operation or a calibration mode of operation, wherein:
  - when the delay locked loop circuit is in the calibration mode of operation:
    - the fixed voltage source is configured to provide the fixed voltage signal as the control-voltage signal for the voltage-controlled delay line; and
    - the delay code setter is configured to apply the delay code setting signal to the voltage-controlled delay line such that it applies one or more of the sequence of different candidate delay codes to the voltage-controlled delay line in order to determine the candidate delay code that results in a predetermined phase difference between the first output signal and the last output signal, and assign that candidate delay code as a selected-delay-code;
  - when the delay locked loop circuit is in the active mode of operation:
    - the feedback circuit is configured to provide the feedback voltage signal as the control-voltage signal for the voltage-controlled delay line; and
    - the voltage-controlled delay line is configured to use the selected-delay-code as the delay code.

<insert exact text of Independent claim 1>.

Advantageously, such a delay locked loop circuit can provide precise calibration for the control voltage signal by setting the delay code during a calibration mode of operation. During the subsequent active mode of operation, the control voltage signal can be limited across variations in PVT (process, voltage temperature) such that it is more likely to remain in an acceptable range of values.

In one or more embodiments, the voltage-controlled delay line comprises a plurality of buffers connected in series.

In one or more embodiments, at least one of the variable components of the voltage-controlled delay line is associated with each of the plurality of buffers.

In one or more embodiments, the fixed voltage signal has a value that is midway through a range of voltage values that enable the DLL circuit to function correctly.

In one or more embodiments, the fixed voltage signal has a value that is equal to half of a supply voltage for the DLL circuit.

In one or more embodiments, the fixed voltage source comprises a potentiometer that is configured to receive calibration-voltage-control-signal. The potentiometer may be operable to tap off a voltage based on the calibration-voltage-control-signal in order to provide the fixed voltage signal.

In one or more embodiments, the predetermined phase difference corresponds to a phase difference of $2\pi$ radians when the delay locked loop circuit is in the active mode of operation.

In one or more embodiments, the switching circuit comprises a control-voltage-connection-switch, which is configured to provide either the fixed voltage signal or the feedback voltage signal as the control-voltage signal for the voltage-controlled delay line.

In one or more embodiments, the delay locked loop circuit further comprises a clock signal generator that is configured to provide:
- a calibration-clock-signal as the clock-in signal for the voltage-controlled delay line when the delay locked loop circuit is in the calibration mode of operation; and
- an active-clock-signal as the clock-in signal for the voltage-controlled delay line when the delay locked loop circuit is in the active mode of operation; wherein the calibration-clock-signal and the active-clock-signal have different frequencies.

In one or more embodiments, the frequency of the calibration-clock-signal is half that of the active-clock-signal.

In one or more embodiments, when the delay locked loop circuit is in the calibration mode of operation:
- the delay code setter is configured to:
  - apply the delay code setting signal to the voltage-controlled delay line such that it applies a plurality of the sequence of different candidate delay codes to the voltage-controlled delay line in order to determine the candidate delay code that results in a predetermined phase difference of Π radians between the first output signal (PH0) and the last output signal (PHN); and
  - assign that candidate delay code as the selected-delay-code.

In one or more embodiments, the delay locked loop circuit further comprises a phase comparator, and wherein, when the delay locked loop circuit is in the calibration mode of operation:
- the phase comparator is configured to compare the phase of the first output signal with the phase of the last output signal in order to provide a lock-signal that is representative of whether or not the phase difference between the first output signal and the last output signal is the predetermined phase difference; and the delay code setter is configured to determine the selected-delay-code based on the lock-signal.

In one or more embodiments, the feedback circuit comprises a phase detector and a charge pump.

In one or more embodiments, when the delay locked loop circuit is in the calibration mode of operation, it is configured to operate in an open loop mode of operation.

In one or more embodiments, when the delay locked loop circuit is in the active mode of operation, it is configured to operate in a closed loop mode of operation.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets.

The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

A delay locked loop (DLL) circuit includes a delay chain that applies a time delay to an input clock signal. The DLL circuit also includes a feedback circuit that phase locks a last output signal to the input clock signal such that it is delayed by 2Π radians with reference to the input clock signal. The feedback circuit can include a phase detector and a charge pump. The delay chain can include a VCDL (voltage-controlled delay line). The magnitude of the time delay that is applied by the VCDL is influenced by a control voltage signal. The VCDL can have a limited range of acceptable control voltages due to limitations associated with a supply voltage and the charge pump's over drive voltage. Therefore, if the DLL's control voltage (vcntrl) exceeds a safe specified range then the DLL will be locked at an incorrect phase alignment. That is, the last output signal of the DLL will not be delayed by 2π radians with reference to the DLL's input reference clock.

Figure 1:
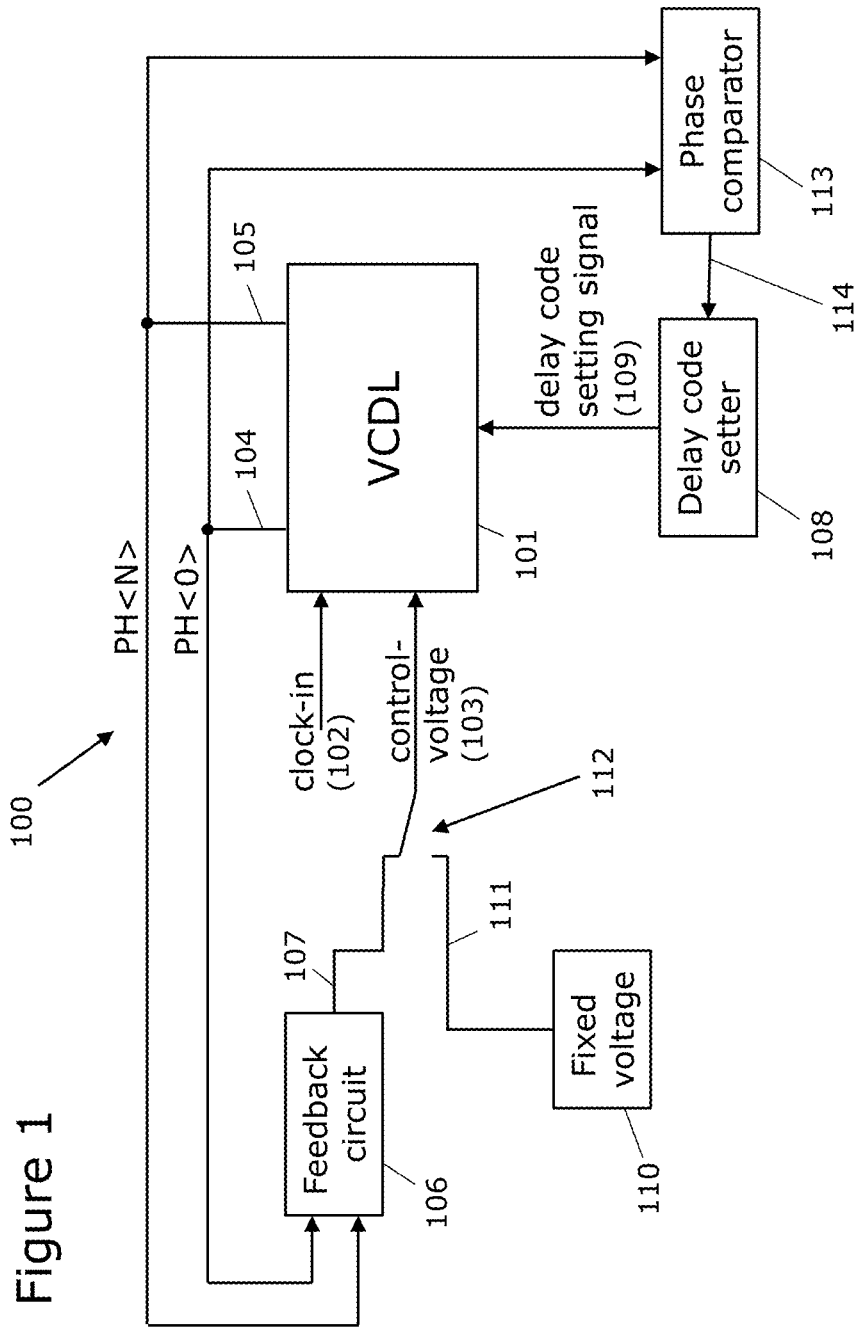
FIG. 1 illustrates an example embodiment of a delay locked loop (DLL) circuit according to the present disclosure.

FIG. 1 illustrates an example embodiment of a delay locked loop (DLL) circuit 100 according to the present disclosure. As will be discussed below, the DLL circuit 100 can be put in either an active mode of operation or a calibration mode of operation. In the calibration mode of operation, a voltage-controlled delay line (VCDL) 101 is calibrated such that a control voltage signal 103 that is applied to the VCDL 101 when the DLL circuit 100 is in the active mode of operation is expected to have a value that reduces the likelihood of it exceeding a range of acceptable values, which would result in incorrect operation of the DLL circuit 100. For example, the VCDL 101 can be calibrated such that the control voltage signal 103 is expected to have a value that is in the middle of an acceptable range of values when the DLL circuit is in the active mode of operation. Therefore, if anything happens that causes the control voltage signal 103 to increase or decrease (such as the temperature of the DLL circuit 100 changes), there is maximum headroom for the control voltage signal 103 to increase or decrease while still having a value that enables the DLL circuit 100 to apply the correct phase delay.

Turning now to FIG. 1 in more detail, the VCDL 101 receives a clock-in signal 102 and a control-voltage signal 103. The VCDL 101 applies a time delay to the clock-in signal 102 in order to provide a first output signal (PH<0>) 104 and a last output signal (PH<N>) 105. In some examples, the first output signal (PH<0>) 104 may be the same signal as the clock-in signal 102 such that the VCDL 101 applies a time delay of zero in providing the first output signal (PH<0>) 104. When the DLL circuit 100 is in the active mode of operation, the last output signal (PH<N>) 105 should be delayed with reference to the first output signal (PH<0>) 104 such that there is a 2π radian phase difference between the signals. In addition, as will be described with reference to FIG. 2, the VCDL 101 may also provide one or more intermediate output signals, PH<1> to PH<N−1>, (not shown) that are phase shifted by less than 2π radians with reference to the first output signal (PH<0>) 104.

The magnitude of the time delay that is applied by the VCDL 101 is based on the control-voltage signal 103 and also a delay code. The delay code defines the values of one or more variable components in the VCDL 101. In this way, the values of the one or more variable components influences the magnitude of the time delay that is applied by the VCDL 101. As will be described with reference to FIG. 2, in one example the variable components may be variable capacitors, although it will be appreciated that any type of variable component, that influences the time delay can be used.

Figure 2:
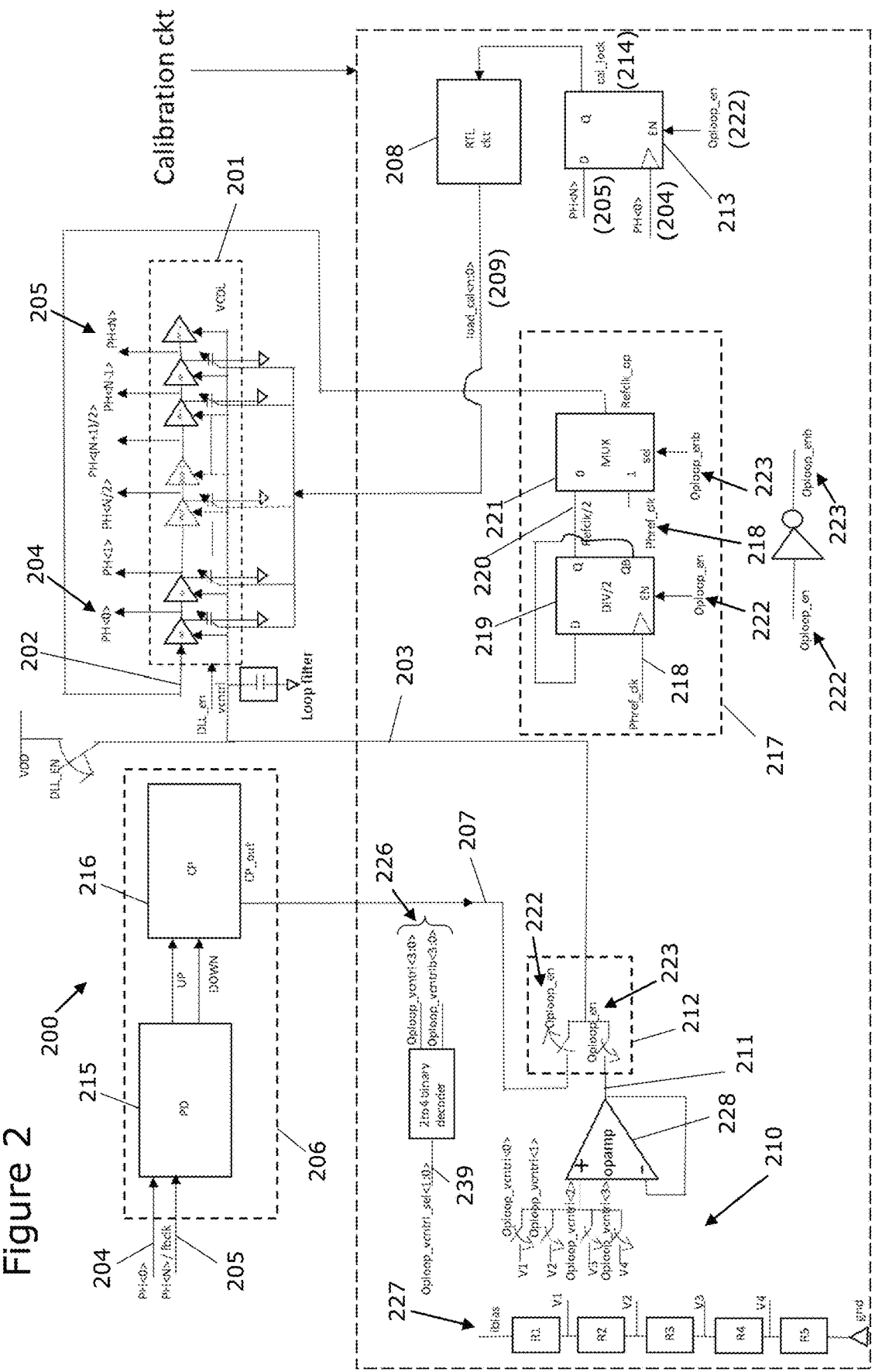
FIG. 2 shows another example of a DLL circuit according to the present disclosure.

The DLL circuit 100 also includes a feedback circuit 106 that is configured to provide a feedback voltage signal 107 based on the phase difference between the first output signal (PH<0>) 104 and the last output signal (PH<N>) 105. As is known in the art, and as shown in FIG. 2, the feedback circuit 106 can be implemented as a phase detector and a charge pump. The DLL circuit 100 also includes a fixed voltage source 110 that provides a fixed voltage signal 111. As will be discussed below: the fixed voltage signal 111 is provided as the control-voltage signal 103 when the DLL circuit 100 is in the calibration mode of operation; and the feedback voltage signal 107 is provided as the control-voltage signal 103 when the DLL circuit 100 is in the active mode of operation. In this way, the DLL circuit 100 is in an open loop configuration when it is in the calibration mode of operation and it is in a closed loop configuration when it is in the active mode of operation.

The DLL circuit 100 also includes a delay code setter 108 that provides a delay code setting signal 109 to the VCDL 101. At any moment in time when the DLL circuit 100 is in the calibration mode of operation, the delay code setting signal 109 represents one of a sequence of different candidate delay codes. The delay code setter 108 is for calibrating the VCDL 101 when the DLL circuit 100 is in the calibration mode of operation.

As shown in FIG. 1, the DLL circuit 100 also includes a switching circuit 112. The switching circuit 112 is for putting the DLL circuit 100 in either an active mode of operation or a calibration mode of operation. In FIG. 1, the switching circuit 112 is implemented as a single switch. However, in other examples, including the example of FIG. 2, more than one switching components (including multiplexers) may be used to control the mode of operation of the DLL circuit 100.

When the DLL circuit 100 is in the calibration mode of operation, the switching circuit 112 connects the fixed voltage source 110 to the VCDL 101. The switching circuit 112 also disconnects the feedback circuit 106 from the VCDL 101. In this way, the fixed voltage source 110 provides the fixed voltage signal 111 as the control-voltage signal 103 for the VCDL 101. As will be discussed below, in one example the fixed voltage signal 111 can have a value that is midway through a range of voltage values that enable the DLL circuit 100 to function correctly. This can be implemented by providing a number of voltage signals that are near to the middle of the supply voltage supply, as shown with a resister divider in FIG. 2.

Also when the DLL circuit 100 is in the calibration mode of operation, the delay code setter 108 applies the delay code setting signal 109 to the VCDL 101 such that it applies one or more of the sequence of different candidate delay codes to the VCDL in order to determine the candidate delay code that results in a predetermined phase difference between the first output signal (PH<0>) 104 and the last output signal (PH<N>) 105. The delay codes setter 108 can then assign that candidate delay code as a selected-delay-code. In this example, the DLL circuit 100 also includes a phase comparator 113 that compares the phase of the first output signal (PH<0>) 104 with the phase of the last output signal (PH<N>) 105. The phase comparator 113 provides a lock-signal 114 as an output signal. The phase comparator 113 in this example sets the value of the lock-signal 114 as: a first value if the phase of the first output signal (PH<0>) 104 does not match the phase of the last output signal (PH<N>) 105; and a second value if the phase of the first output signal (PH<0>) 104 does match the phase of the last output signal (PH<N>) 105. In this way, the delay code setter 108 can sequentially apply a plurality of candidate delay codes to the VCDL 101 until one is found that results in a predetermined phase difference between the first output signal (PH<0>) 104 and the last output signal (PH<N>) 105. This predetermined phase difference is one that corresponds to a phase difference of $2\pi$ radians when the DLL circuit 100 is in the active mode of operation. As will be described below with reference to FIG. 2, the predetermined phase difference in the calibration mode of operation does not necessarily need to be $2\pi$ radians.

When the DLL circuit 100 is in the active mode of operation, the switching circuit 112 connects the feedback circuit 106 to the VCDL 101. The switching circuit 112 also disconnects the fixed voltage source 110 from the VCDL 101. In this way, the feedback circuit 106 provides the feedback voltage signal 107 as the control-voltage signal 103 for the VCDL 101.

Also when the DLL circuit 100 is in the active mode of operation, the VCDL 101 uses the selected-delay-code (i.e., the one that was determined during the calibration mode of operation) as the delay code. That is, the variable components in the VCDL 101 are set such that they have values that are consistent with those that were identified during the calibration mode of operation as resulting in the predetermined phase difference between the first output signal (PH<0>) 104 and the last output signal (PH<N>) 105. The DLL circuit 100 can then operate in a closed loop configuration in the active more of operation such that the value of the feedback voltage signal 107 is expected to have the same value as the fixed voltage signal 111 in order to achieve the desired phase difference of $2\pi$ radians between the first output signal (PH<0>) 104 and the last output signal (PH<N>) 105. Then, if there are any PVT (process, voltage, temperature) variations during operation of the DLL circuit 100 in the active mode of operation, the DLL circuit 100 is well-placed to accommodate any associated changes in the feedback voltage signal 107 that occur as a result of the closed loop configuration without saturating the control of the VCDL 101.

Advantageously, the example of FIG. 1 can limit the control voltage signal 103 across variations in PVT (process, voltage temperature). In this example, it can achieve this by calibrating an RC delay (by applying the candidate delay codes) to maintain the control voltage signal at a value that is in the middle of the supply voltage (e.g., VDD/2) while the feedback circuit 106 is disabled or disconnected. In other examples, the control voltage signal can be maintained at a different value, which may or may not be near to VDD/2. Such a control voltage can be provided by a resister divider (as shown in FIG. 2) or any bias generation voltage source. Either way, the DLL circuit 100 can vary the RC delay of the VCDL 101 until the DLL's last output signal 105 is $2\pi$ radians apart from first output signal 104. Once the calibrated RC value is determined, the DLL circuit enters into a closed loop mode of operation (referred to above as an active mode of operation) using the final calibrated RC value of the VCDL 101 to lock near to the fixed value of the control voltage signal that was used in calibration mode, which may be VDD/2.

FIG. 2 shows another example of a DLL circuit 200 according to the present disclosure. Features of FIG. 2 that are also shown in FIG. 1 have been given corresponding reference numbers in the 200 series, and will not necessarily be described again here. As will be discussed below, the DLL circuit 200 includes a calibration-mode-enable signal (Oploop_en) 222 that is set: high when the DLL circuit 200 is to be put in the calibration mode of operation; and low when the DLL circuit 200 is to be put in the active mode of operation. The DLL circuit 200 also generates and uses the inverse of the calibration-mode-enable signal (Oploop_enb) 223.

The VCDL 201 is implemented as a chain of N+2 delay buffers in series with each other in this example. The first buffer in the chain receives the clock-in signal 202 as an input signal and provides the first output signal (PH<0>) as its output signal. The penultimate buffer in the chain provides the last output signal (PH<N>) as its output signal. As shown in FIG. 2, a variable capacitor is respectively connected between the output terminals of each of the first to the penultimate buffers and a ground terminal. In the same way that is described above with reference to FIG. 1, the values of the variable capacitors are set by a delay code. Therefore, a variable component (a variable capacitor in this example, although it could be a variable resistor or any other suitable type of variable component) is associated with each buffer such that it contributes to defining the magnitude of the time delay that is applied by each buffer in the VCDL 201.

In this example, each of the first to the penultimate buffers provides an output signal that is a phase shifted version of the clock-in signal 202. Since each of the buffers applies the same amount of delay in this example, the phase of each of the output signals is equally shifted with respect to the earlier output signal in the phase, and if the DLL circuit 200 is operating correctly the last output signal 205 is phase shifted by $2\pi$ radians with respect to the first output signal 204.

The feedback circuit 206 in this example is implemented as a phase detector 215 and a charge pump 216. The phase detector 215 compares the first output signal (PH<0>) 204 and the last output signal (PH<N>) 205 and, depending upon the result of the comparison it controls the charge pump 216 such that it either increases or decreases the feedback voltage signal 207 that is provided as the output signal of the charge pump 216. In this way, when the DLL circuit 200 is in the active mode of operation, the feedback voltage signal 207 is adjusted such that the first output signal (PH<0>) 204 and the last output signal (PH<N>) 205 are brought into phase with each other. Due to the time delay that is applied by the VCDL 201, this should mean that the last output signal (PH<N>) 205 is phase shifted by $2\pi$ radians with respect to the first output signal (PH<0>) 204.

The fixed voltage source 210 in this example is configurable such that the voltage level of the fixed voltage signal 211 can be set by a user. In FIG. 2, the fixed voltage source 210 includes a potentiometer 227 (that can also be referred to as a resistive divider). It will be appreciated that in other examples the fixed voltage source 210 may be implemented differently, and that it can include any bias voltage design. The fixed voltage source 210 receives a calibration-voltage-control-signal 239, which defines a required level for the voltage of the fixed voltage signal 211. In this example, the DLL circuit 200 converts the calibration-voltage-control-signal 239 into four binary signals 226 that are used to control four corresponding switches. Each of these four switches is connected to a different node in the potentiometer 227 such that a different voltage level can be tapped off and connected to an input terminal of an operational amplifier (op-amp) 228. The op-amp 228 is configured as a unity gain amplifier such that the output signal of the op-amp 228 is the fixed voltage signal 211.

The DLL circuit 200 of FIG. 2 includes a control-voltage-connection-switch 212, which is part of a switching circuit for controlling the mode of operation of the DLL circuit 200. In the same way as FIG. 1, the control-voltage-connection-switch 212 provides either the fixed voltage signal 211 or the feedback voltage signal 207 as the control-voltage signal 203 for the VCDL 201.

In the example of FIG. 2, the DLL circuit 200 also includes a clock signal generator 217 that provides a calibration-clock-signal when the DLL circuit 200 is in the calibration mode of operation and provides an active-clock-signal when the DLL circuit 200 is in the active mode of operation. The calibration-clock-signal and the active-clock-signal have different frequencies. In this example, the frequency of the calibration-clock-signal is half that of the active-clock-signal.

The clock signal generator 217 receives a reference clock signal 218, which in this example is also the active-clock-signal. When the DLL circuit 200 is in the calibration mode of operation, a D-type flip flop is enabled such that it halves the frequency of the reference clock signal 218 in order to provide the calibration-clock-signal (Refclk/2) 220. The clock signal generator 217 also includes a multiplexer 221 (which can be considered as another component of the switching circuit). The multiplexer 221 has two input terminals: one that receives the calibration-clock-signal (Refclk/2) 220; and the other that receives the active-clock-signal (Phref_clk) 218. The multiplexer 221 is controlled by the inverse of the calibration-mode-enable signal (Oploop_enb) 223 (although it could equally be controlled by the calibration-mode-enable signal (Oploop_en) 222) such that: the active-clock-signal (Phref_clk) 218 is provided to the VCDL 201 as the clock-in signal 202 when the DLL circuit 200 is in the active mode of operation; and the calibration-clock-signal (Refclk/2) 220 is provided to the VCDL 201 as the clock-in signal 202 when the DLL circuit 200 is in the calibration mode of operation.

As we will now describe with reference to the delay code setter 208, use of a calibration-clock-signal (Refclk/2) 220 that has a frequency that is different to that of the active-clock-signal (Phref_clk) 218 can improve the ability of the delay code setter 208 to determine the selected-delay-code that will result in the $2\pi$ radians phase shift between the first output signal (PH<0>) 204 and the last output signal (PH<N>) 205 when the DLL circuit is in the active mode of operation.

The delay code setter block 208 of FIG. 2 is implemented as an RTL (resistor transistor logic) circuit. The delay code setter block 208 provides a delay code setting signal (load_cal<n:0>) 209 that periodically applies a different candidate delay code to the VCDL 201. In this example, the delay code setter block 208 starts with the lowest candidate delay code and gradually increments the value of the candidate delay code until a code is applied that results in a predetermined phase difference between the first output signal (PH<0>) 204 and the last output signal (PH<N>) 205.

In this example, since the calibration-clock-signal (Refclk/2) 220 has a frequency that is half that of the active-clock-signal (Phref_clk) 218, a predetermined phase difference between the first output signal (PH<0>) 204 and the last output signal (PH<N>) 205 of Π radians in the calibration mode of operation will correspond to $2\pi$ radians in the active mode of operation. As will be appreciated from the description that follows, identifying a Π radians phase difference in the calibration mode can lend itself to an efficient implementation that requires only a D-type flip flop 213 to compare the phase of the first output signal (PH<0>) 204 and the last output signal (PH<N>) 205, without suffering from any metastability issues. That is, if the DLL circuit 200 did not halve the clock frequency in the calibration mode of operation, there is a risk that the delay code setter 208 could determine the selected-delay-code as a code that results in a Π radian phase shift in the active mode of operation (when it should be $2\pi$ radians to function correctly).

Figure 3:
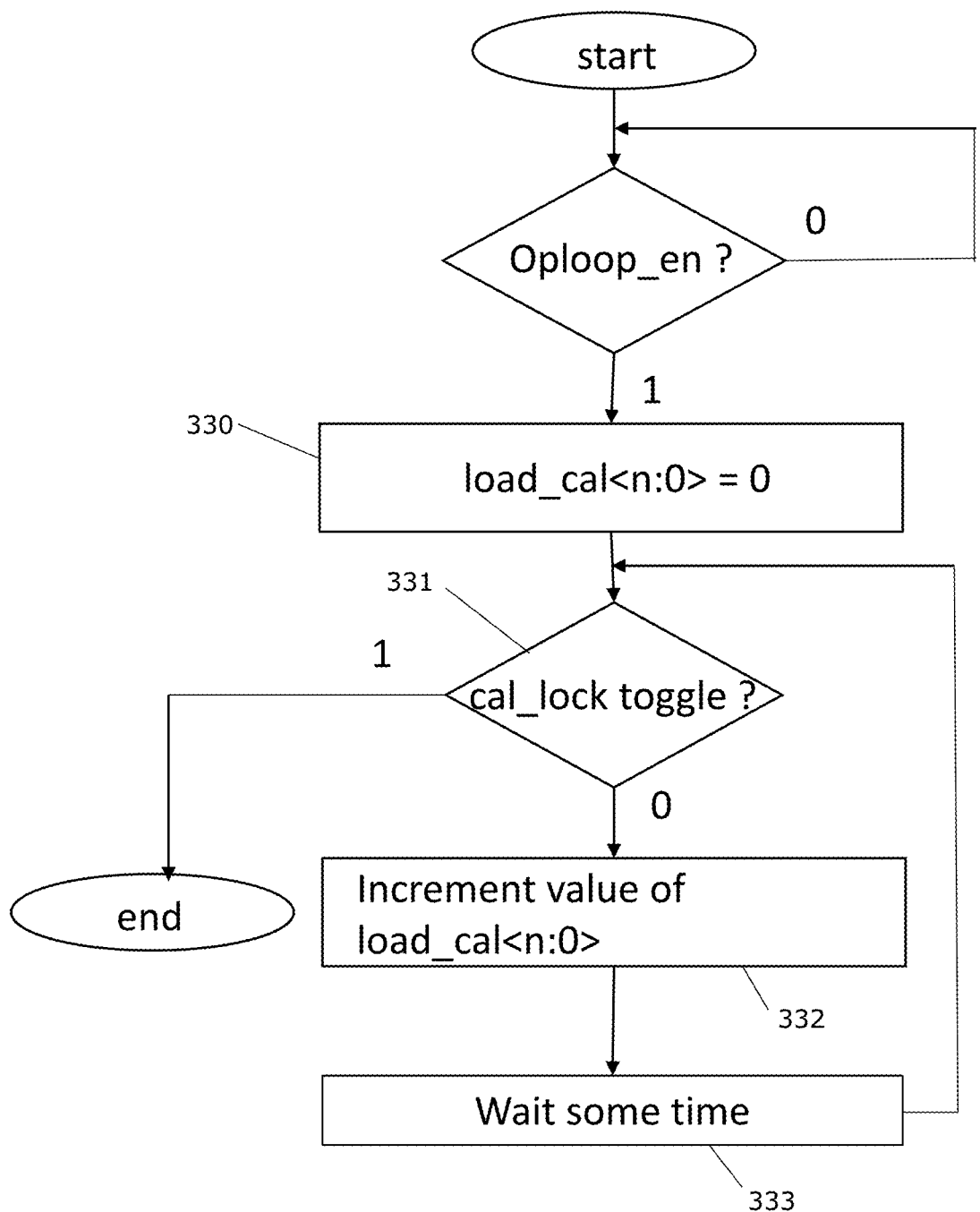
FIG. 3 shows a flow chart that will be used to describe the functionality of the delay code setter and the D-type flip flop of FIG. 2.

We will now describe the functionality of the delay code setter 208 and the D-type flip flop 213 of FIG. 2 also with reference to the flow chart of FIG. 3. The flow chart of FIG. 3 includes an initial step of checking if the calibration-mode-enable signal (Oploop_en) 222 has a logic high value, which indicates that the DLL circuit 200 is in the calibration mode of operation. If the calibration-mode-enable signal (Oploop_en) 222 does have a logic high value, then the delay code setter 208 initialises the delay code setting signal (load_cal<n:0>) 209 by setting it to a first candidate delay code (step 330 in FIG. 3).

Then, with the first candidate delay code in use by the VCDL 201, the D-type flip flop 213 receives the first output signal (PH<0>) 204 at its clock input terminal and it receives the last output signal (PH<N>) 205 at its data input terminal. In this example, the last output signal (PH<N>) 205 is provided to the data input terminal of the D-type flip flop 213 such that it is sampled by the first output signal (PH<0>) 204. However, it will be appreciated that these signals can be swapped over, and that any suitable signals can be used that will result in a transition either from 1 to 0 or from 0 to 1 at that correct toggling time, such that a lock signal is generated as part of the finite state machine (FSM) algorithm of FIG. 3. That FSM, as will be discussed below, can check for a toggle signal of cal_lock; that is, the FSM only looks for a data transition from 0 to 1, or 1 to 0.

The output signal of the D-type flip flop 213, which we will refer to as a lock-signal 214 (labelled as cal_lock in FIGS. 2 and 3), will have a value of logic 0 for the first candidate delay code because there is only a small phase difference between the first output signal (PH<0>) 204 and the last output signal (PH<N>) 205. This is because the last output signal (PH<N>) 205 has a value of logic 0 when the first output signal (PH<0>) 204 clocks the D-type flip flop 213. This check of the status of the lock-signal 214 is represented in FIG. 3 by step 331 where a check is made as to whether the lock-signal (cal_lock) has toggled to a logic 1. If it has not, then the delay code setter 208 increments the delay code setting signal such that it represents the next candidate delay code in the sequence. This is shown as block 332 in FIG. 3. At step 333, the D-type flip flop 213 then waits a period of time, which may be a predetermined period of time, for the VCDL 201 to settle and for the last output signal (PH<N>) 205 to stabilise. Then, the method of FIG. 3 repeats step 331 of FIG. 3 and the loop continues until the status of the lock-signal 214 changes to a logic 1, at which point the flow chart of FIG. 3 ends and the final candidate delay code that was applied is stored as the selected-delay-code. As discussed above, it is this selected-delay-code that will be used by the VCDL 201 in the active mode of operation.

Figure 4:
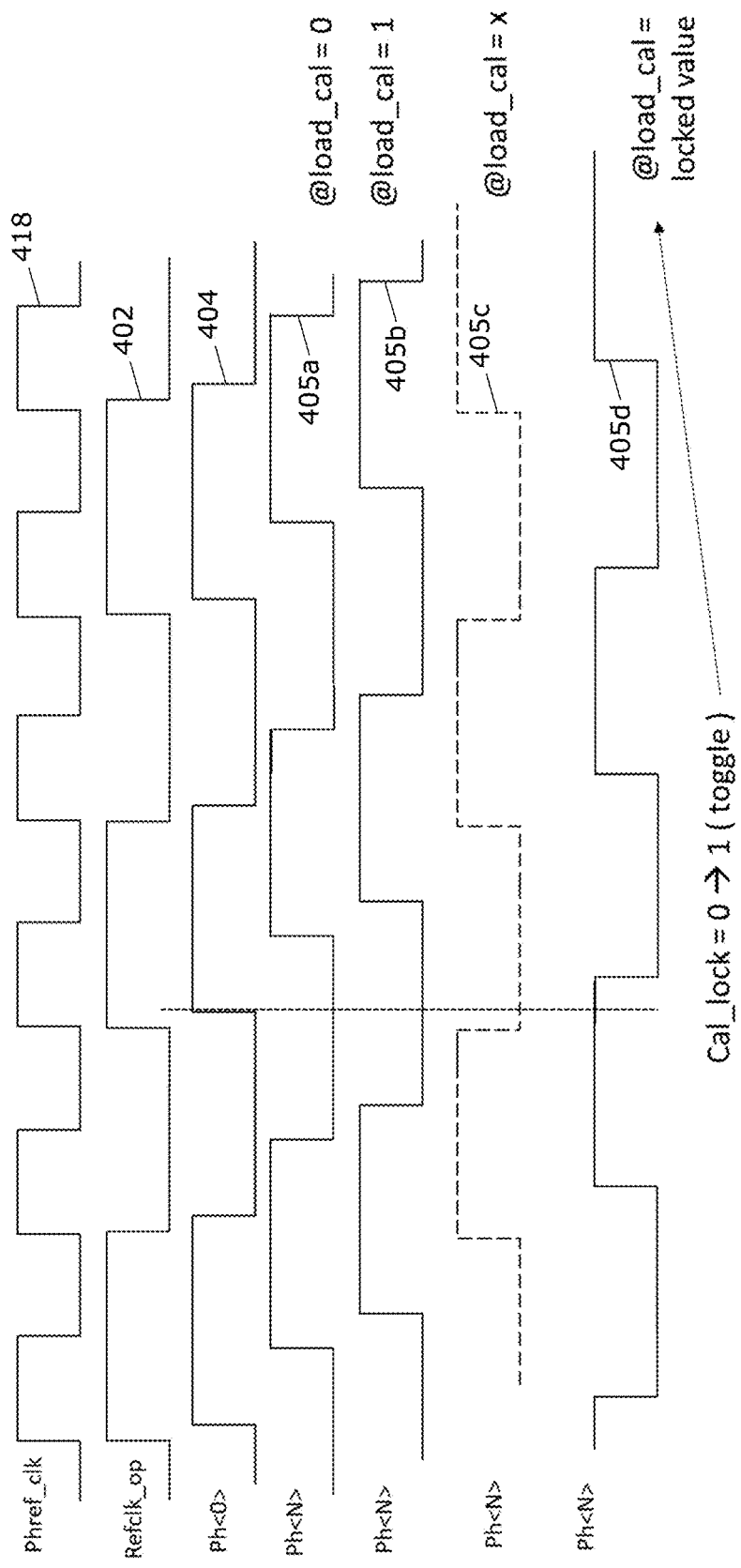
FIG. 4 shows a timing diagram that further illustrates the functionality of the flow chart of FIG. 3.

FIG. 4 shows a timing diagram that further illustrates the functionality of the flow chart of FIG. 3.

The uppermost plot in FIG. 4 is the reference clock signal (Phref_clk) 418, which, as discussed above, is also the active-clock-signal (Phref_clk).

The next plot is the clock-in signal (Refclk_op) 402, which, because the DLL circuit is in the calibration mode of operation, is the calibration-clock-signal (Refclk/2). As can be seen from FIG. 4, the calibration-clock-signal (Refclk/2) has half the frequency of the reference clock signal (Phref_clk) 418.

The next plot is the first output signal (PH<0>) 404.

The next plot is the last output signal (PH<N>) 405a for a first iteration of the loop of FIG. 4; that is, when the first candidate delay code is applied. It can be seen from this plot that the last output signal (PH<N>) 405a has not been phase shifted enough with reference to the first output signal (PH<0>) 404. As discussed above, the target phase shift when the clock frequency is halved is Π radians.

The next two plots are the last output signals (PH<N>) 405b,c for subsequent iterations of the loop of FIG. 4; that is, when subsequent candidate delay codes in the sequence are applied. It can be seen from this these plots that the last output signal (PH<N>) 405b,c still have not been phase shifted enough with reference to the first output signal (PH<0>) 404.

The lowermost plot is the last output signal (PH<N>) 405d for a subsequent iteration of the loop of FIG. 4 when a candidate delay code has been applied that results in a change of state of the lock-signal (cal_lock). The vertical dotted line that has been added to FIG. 4 shows that the last output signal (PH<N>) 405d in the lowermost plot is the first one in the sequence which has a logic 1 value for a rising edge transition in the first output signal (PH<0>) 404. Therefore, the candidate delay code that was applied when the last output signal (PH<N>) 405d was generated is stored as the selected-delay-code. This is indicated in FIG. 4 as "@load_cal=locked value".

Figure 5:
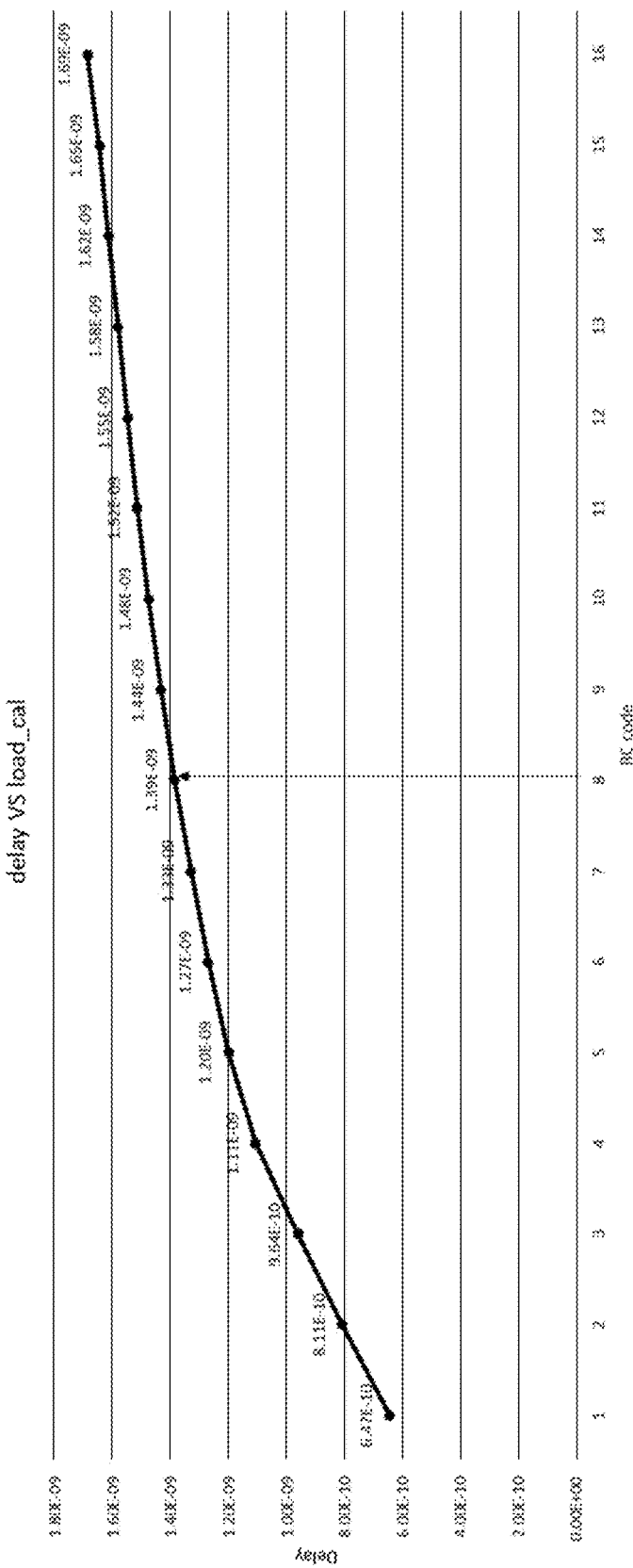
FIG. 5 shows a plot of candidate delay code on the horizontal axis versus time delay on the vertical axis.

FIG. 5 shows a plot of candidate delay code index on the horizontal axis, where each index represents a different candidate delay code in the sequence. In this example, a sequence of 16 candidate delay codes is shown. Time delay for the entire VCDL in seconds is shown on the vertical axis.

For the plot of FIG. 5, the eighth candidate delay code is identified as the selected-delay-code, which corresponds to a time delay of 1.39 ns.

Figure 6:
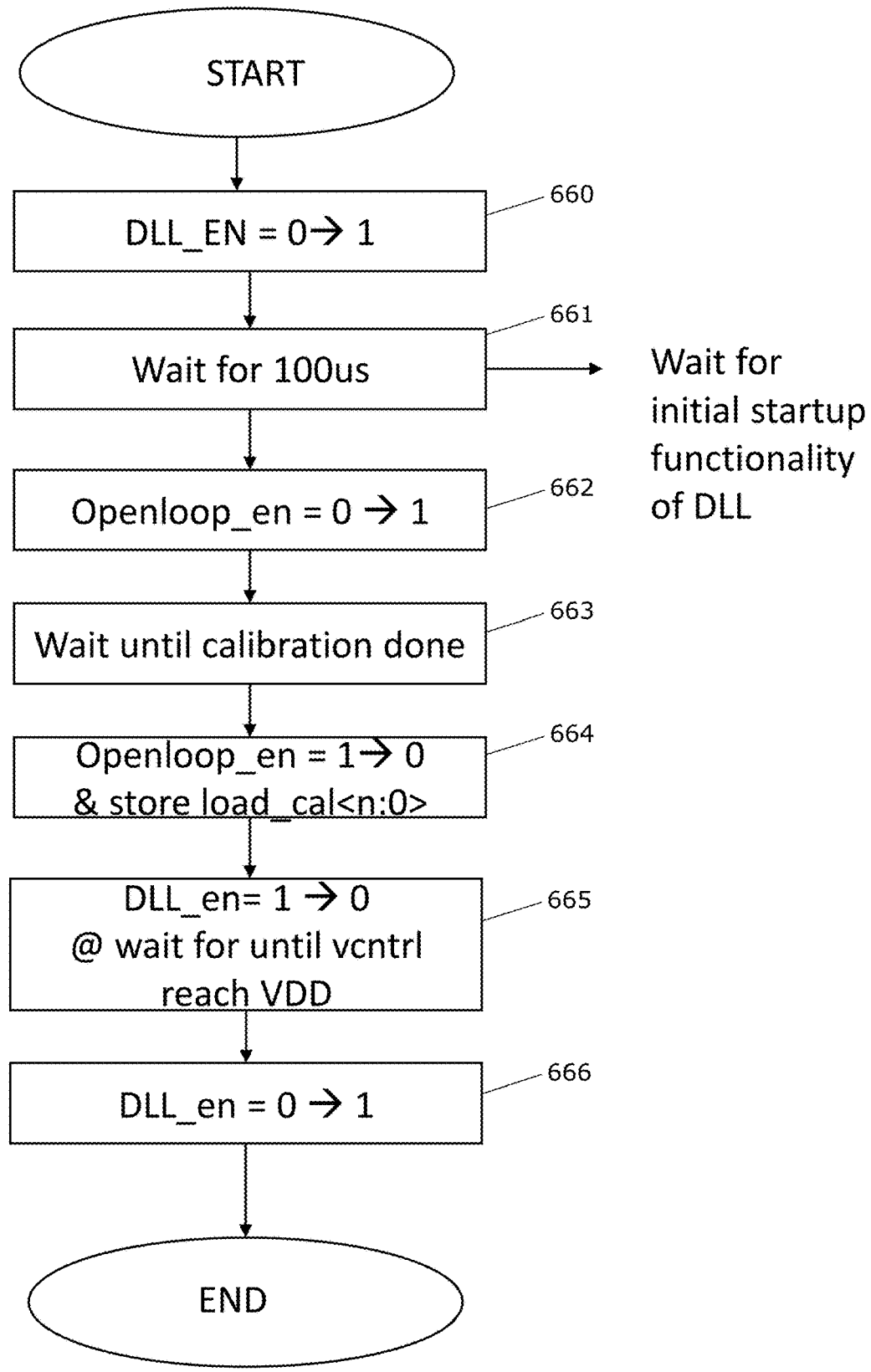
FIG. 6 illustrates a flow chart for a calibration sequence that can be performed by the DLL circuit of FIG. 2.

FIG. 6 illustrates a flow chart for a calibration sequence that can be performed by the DLL circuit of FIG. 2. The names of signals that are included in FIG. 6 are also shown in FIG. 2.

At step 660, the DLL circuit is enabled by setting a DLL_EN signal to logic 1. As can be seen from FIG. 2, setting this signal in this way opens a switch to disconnect the control voltage signal 203 signal from the VDD supply. This is before a fixed voltage is applied as the control voltage signal 203 in the calibration mode, and is also the same in the active mode otherwise the control voltage signal 203 always will remain at VDD. The calibration sequence then waits for 100 μs at step 661 to wait for the initial startup functionality of the DLL circuit 200.

At step 662, the calibration-mode-enable signal (Oploop_en) 222 is set to a logic high value. As discussed in detail above, this puts the DLL circuit 200 into the calibration mode of operation. When the calibration-mode-enable signal (Oploop_en) 222 is set to a high value:

the fixed voltage signal 211 is provided as the control-voltage signal 203 for the VCDL 201;

the D-type flip flop 222 of the clock signal generator 217 is enabled;

the multiplexer 221 of the clock signal generator 217 is controlled such that the calibration-clock-signal (Refclk/2) 220 is provided as the clock-in signal 202 for the VCDL 201; and the D-type flip flop 213 associated with the delay code setter 208 is enabled.

At step 663, the flow chart of FIG. 6 waits for the calibration sequence of FIG. 3 to end, at which point a selected-delay-code has been determined. Then, at step 664, the flow chart of FIG. 6 sets the calibration-mode-enable signal (Oploop_en) 222 to a logic low value such that the DLL circuit 200 enters the active mode of operation such that:

the feedback voltage signal 207 is provided as the control-voltage signal 203 for the VCDL 201;

the D-type flip flop 222 of the clock signal generator 217 is disabled;

the multiplexer 221 of the clock signal generator 217 is controlled such that the active-clock-signal (Phref_clk) 218 is provided as the clock-in signal 202 for the VCDL 201;

the D-type flip flop 213 associated with the delay code setter 208 is disabled; and the VCDL 201 uses the selected-delay-code.

At step 665, the DLL circuit is disabled by setting the DLL_EN signal to logic 0, such that the control voltage signal 203 will tend towards the supply voltage, VDD. The flow chart then waits for the control voltage signal 203 to reach the supply voltage, VDD, and at step 666 the DLL circuit is reenabled by setting the DLL_EN signal to logic 1. The DLL circuit 200 has now been calibrated and is in an active mode of operation.

Figure 7:
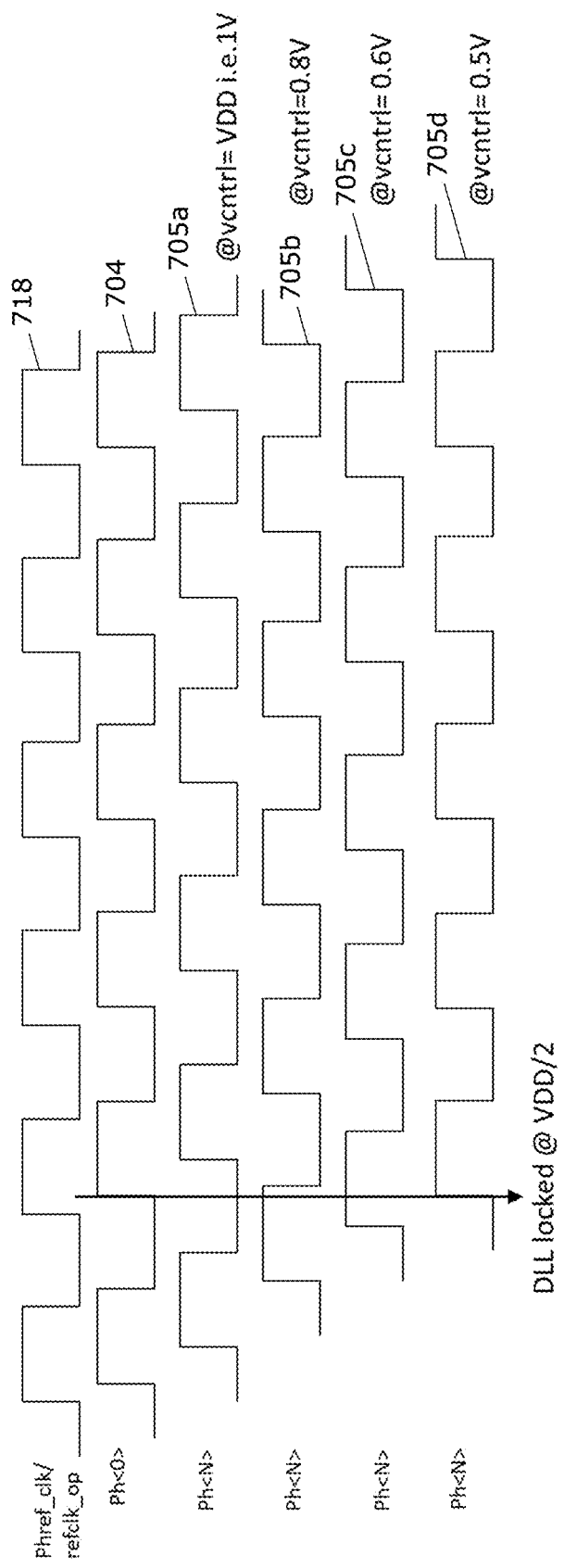
FIG. 7 shows a timing diagram that will be used to describe the functionality of a calibrated DLL circuit when it is in the active mode of operation immediately after the last step of the flow chart of FIG. 6.

FIG. 7 shows a timing diagram that will be used to describe the functionality of a calibrated DLL circuit when it is in the active mode of operation immediately after the last step of the flow chart of FIG. 6. That is, when:

the control voltage signal has been initialised as the supply voltage (VDD); and the selected-delay-code has been determined and is being applied such that the variable components of the VCDL present a load in the active mode of operation that corresponds to the load that was determined in the calibration mode of operation as achieving the desired phase shift when the control voltage signal was at the fixed voltage.

The uppermost plot in FIG. 7 is the reference clock signal (Phref_clk) 718, which as discussed above is also the active-clock-signal (refclk_op) when the DLL circuit is in the active mode of operation.

The next plot is the first output signal (PH<0>) 704.

The third plot is the last output signal (PH<N>) 705a for a first iteration of the closed loop feedback of FIG. 2; that is, the feedback loop that includes the phase detector 215 and the charge pump 216. Because the control voltage signal has been initialised as the supply voltage (VDD), which in this example is 1V, the phase detector determines that the phase difference between the first output signal (PH<0>) 704 and the last output signal (PH<N>) 705a is too large, and therefore it causes the charge pump 216 to reduce the control voltage signal (Vcntrl).

The fourth plot is the last output signal (PH<N>) 705b for a second iteration of the feedback loop of FIG. 2. For the second iteration, the control voltage signal (Vctrl) has been reduced to 0.8V. Nonetheless, the phase detector still determines that the phase difference between the first output signal (PH<0>) 704 and the last output signal (PH<N>) 705b is too large, and therefore it causes the charge pump 216 to further reduce the control voltage signal (Vcntrl).

The fifth plot is the last output signal (PH<N>) 705c for a third iteration of the feedback loop of FIG. 2. For the third iteration, the control voltage signal (Vctrl) has been reduced further to 0.6V. Nonetheless, the phase detector still determines that the phase difference between the first output signal (PH<0>) 704 and the last output signal (PH<N>) 705c is too large, and therefore it causes the charge pump 216 to further reduce the control voltage signal (Vcntrl).

The sixth and lowermost plot is the last output signal (PH<N>) 705d for a fourth iteration of the feedback loop of FIG. 2. For this iteration, the control voltage signal (Vctrl) has been reduced further to 0.5V. For this iteration, the phase detector 215 determines that the phase difference between the first output signal (PH<0>) 704 and the last output signal (PH<N>) 705d is zero (or close enough to zero), and therefore it causes the charge pump 216 to maintain the control voltage signal (Vcntrl) at its current value of 0.5V. Therefore, in the closed loop active mode of operation, the feedback circuit 206 has settled on a control voltage signal of 0.5V, which corresponds to the fixed voltage signal that was applied during the calibration mode of operation. It will be recalled that the fixed voltage signal was set at VDD/2 to provide a maximum positive and negative margin for the voltage control signal to drift during the active mode of operation, without trying to take a value that is outside of the achievable range between 0V and the supply voltage (VDD). Therefore, the DLL circuit has been successfully calibrated during the calibration mode of operation by determining and applying the selected-delay-code that achieves the desired functionality during the active mode of operation.

The functionality that is described above can be summarised as follows:

Load calibration is performed by enabling the calibration-mode-enable signal (Oploop_en) 222.

When the calibration-mode-enable signal (Oploop_en) 222 is enabled, a fixed voltage is selected for use as the control voltage signal (vcntrl) by a resistor divider circuit 227, while disabling the charge pump 216 and keeping the fixed voltage (vcntrl) close to VDD/2 to achieve a good vcntrl range across temperature variation.

By keeping the fixed voltage (vcntrl) close to VDD/2, the candidate delay codes (load_cal<n:0>) are varied from 0 until the lock-signal (cal_lock) 214 toggles.

The value at which the lock-signal (cal_lock) 214 will toggle, the last output signal, PH<N>, 205 will be delayed by half cycle with respect to the first output signal, PH<0>, 204. Noting that this half cycle corresponds to the DLL's input clock period when the DLL circuit is in the active mode of operation. Therefore, the candidate delay code (load_cal<n:0>) that caused the lock-signal (cal_lock) 214 to toggle will result in the last output signal, PH<N>, 205, being delayed by an entire clock period (Tclk) with respect to the first output signal, PH<0>, 204 when the DLL circuit 200 is in the active mode of operation.

Hence, when the DLL circuit is in the closed loop active mode of operation, the DLL circuit 200 will be locked near to the control voltage signal (vcntrl) value that was used in the open loop calibration mode of operation, i.e. VDD/2, by keeping same candidate delay code (load_cal value) at which the lock-signal (cal_lock) 214 toggled.

Advantageously, the DLL circuits described herein can provide precise calibration for the control voltage signal by varying RC delay across PVT during a calibration mode of operation before entering a locked condition in a closed loop configuration during an active mode of operation. Due to a limited range of the control voltage signal (Vcntrl), for instance it cannot fall outside of a range defined by ground and the supply voltage (VDD), the value of the control voltage signal that is applied to the voltage controlled delay line should stay within those limits across expected PVT variations.

Examples disclosed herein relate to a calibration circuit for a wide range frequency DLL circuit, which can represent an efficient and novel approach for gain calibration of a delay line.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A delay locked loop circuit comprising:
a voltage-controlled delay line that comprises one or more variable components, wherein the voltage-controlled delay line is configured to:
receive a clock-in signal;
receive a control-voltage signal; and
apply a time delay to the clock-in signal in order to provide a first output signal and a last output signal, wherein the magnitude of the time delay is based on the control-voltage signal and a delay code, and wherein the delay code defines the values of the one or more variable components in the voltage-controlled delay line;
a feedback circuit that is configured to provide a feedback voltage signal based on the phase difference between the first output signal and the last output signal;
a delay code setter that is configured to provide a delay code setting signal that represents one of a sequence of different candidate delay codes;
a fixed voltage source that is configured to provide a fixed voltage signal; and
a switching circuit that is configured to put the delay locked loop circuit in either an active mode of operation or a calibration mode of operation, wherein:
when the delay locked loop circuit is in the calibration mode of operation:
the fixed voltage source is configured to provide the fixed voltage signal as the control-voltage signal for the voltage-controlled delay line; and
the delay code setter is configured to apply the delay code setting signal to the voltage-controlled delay line such that it applies one or more of the sequence of different candidate delay codes to the voltage-controlled delay line in order to determine the candidate delay code that results in a predetermined phase difference between the first output signal and the last output signal, and assign that candidate delay code as a selected-delay-code;
when the delay locked loop circuit is in the active mode of operation:
the feedback circuit is configured to provide the feedback voltage signal as the control-voltage signal for the voltage-controlled delay line; and
the voltage-controlled delay line is configured to use the selected-delay-code as the delay code.

2. The delay locked loop circuit of claim 1, wherein the voltage-controlled delay line comprises a plurality of buffers connected in series.

3. The delay locked loop circuit of claim 2, wherein at least one of the variable components of the voltage-controlled delay line is associated with each of the plurality of buffers.

4. The delay locked loop circuit of claim 1, wherein the fixed voltage signal has a value that is midway through a range of voltage values that enable the delay locked loop circuit to function correctly.

5. The delay locked loop circuit of claim 4, wherein the fixed voltage signal has a value that is equal to half of a supply voltage for the delay locked loop circuit.

6. The delay locked loop circuit of claim 1, wherein the fixed voltage source comprises a potentiometer that is configured to receive calibration-voltage-control-signal, wherein the potentiometer is operable to tap off a voltage based on the calibration-voltage-control-signal in order to provide the fixed voltage signal.

7. The delay locked loop circuit of claim 1, wherein the predetermined phase difference corresponds to a phase difference of 2Π radians when the delay locked loop circuit is in the active mode of operation.

8. The delay locked loop circuit of claim 1, wherein the switching circuit comprises a control-voltage-connection-switch, which is configured to provide either the fixed voltage signal or the feedback voltage signal as the control-voltage signal for the voltage-controlled delay line.

9. The delay locked loop circuit of claim 1, further comprising a clock signal generator that is configured to provide:
a calibration-clock-signal as the clock-in signal for the voltage-controlled delay line when the delay locked loop circuit is in the calibration mode of operation; and an active-clock-signal as the clock-in signal for the voltage-controlled delay line when the delay locked loop circuit is in the active mode of operation;

wherein the calibration-clock-signal and the active-clock-signal have different frequencies.

10. The delay locked loop circuit of claim 9, wherein the frequency of the calibration-clock-signal is half that of the active-clock-signal.

11. The delay locked loop circuit of claim 10, wherein, when the delay locked loop circuit is in the calibration mode of operation:

the delay code setter is configured to:

apply the delay code setting signal to the voltage-controlled delay line such that it applies a plurality of the sequence of different candidate delay codes to the voltage-controlled delay line in order to determine the candidate delay code that results in a predetermined phase difference of Π radians between the first output signal and the last output signal; and assign that candidate delay code as the selected-delay-code.

12. The delay locked loop circuit of claim 1, further comprising a phase comparator, and wherein, when the delay locked loop circuit is in the calibration mode of operation:

the phase comparator is configured to compare the phase of the first output signal with the phase of the last output signal in order to provide a lock-signal that is representative of whether or not the phase difference between the first output signal and the last output signal is the predetermined phase difference; and the delay code setter is configured to determine the selected-delay-code based on the lock-signal.

13. The delay locked loop circuit of claim 1, wherein the feedback circuit comprises a phase detector and a charge pump.

14. The delay locked loop circuit of claim 1, wherein, when the delay locked loop circuit is in the calibration mode of operation, it is configured to operate in an open loop mode of operation.

15. The delay locked loop circuit of claim 1, wherein, when the delay locked loop circuit is in the active mode of operation, it is configured to operate in a closed loop mode of operation.

* * * * *